(12) United States Patent
Vidu et al.

(10) Patent No.: US 8,906,733 B2
(45) Date of Patent: Dec. 9, 2014

(54) METHODS FOR FORMING NANOSTRUCTURES AND PHOTOVOLTAIC CELLS IMPLEMENTING SAME

(75) Inventors: Ruxandra Vidu, Citrus Heights, CA (US); Brian Argo, Hortonville, WI (US); John Argo, West Sacramento, CA (US); Pieter Stroeve, Davis, CA (US); Saif Islam, Davis, CA (US); Jie-Ren Ku, Davis, CA (US); Michael Chen, Cupertino, CA (US)

(73) Assignees: Q1 Nanosystems, Inc., Sacramento, CA (US); The Regents Of The University Of California, Oakland, CA (US)

(*) Notice: Subject to any disclaimer, the term of this patent is extended or adjusted under 35 U.S.C. 154(b) by 63 days.

(21) Appl. No.: 12/911,657

(22) Filed: Oct. 25, 2010

(65) Prior Publication Data

US 2011/0036395 A1 Feb. 17, 2011

Related U.S. Application Data

(63) Continuation of application No. 11/466,411, filed on Aug. 22, 2006, now Pat. No. 7,847,180.

(60) Provisional application No. 60/710,097, filed on Aug. 22, 2005, provisional application No. 60/710,262, filed on Aug. 22, 2005.

(51) Int. Cl.
*H01L 31/0236* (2006.01)
*C30B 25/00* (2006.01)
(Continued)

(52) U.S. Cl.
CPC .. *H01L 31/035227* (2013.01); *H01L 31/02167* (2013.01); *Y02E 10/52* (2013.01);
(Continued)

(58) Field of Classification Search
USPC ............ 136/252, 255; 428/400, 687; 438/94, 438/98, 57
See application file for complete search history.

(56) References Cited

U.S. PATENT DOCUMENTS

| | | |
|---|---|---|
| 3,150,999 A | 9/1964 | Rudenberg et al. |
| 4,099,986 A | 7/1978 | Diepers |

(Continued)

FOREIGN PATENT DOCUMENTS

| | | |
|---|---|---|
| CN | 1855552 A | 11/2006 |
| EP | 1 703 569 A2 | 9/2006 |

(Continued)

OTHER PUBLICATIONS

Routkevitch et al., "Nonlithographic Nano-Wire Arrays: Fabrication, Physics, and Device Applications", IEEE, 1996.*

(Continued)

*Primary Examiner* — Matthew Martin
(74) *Attorney, Agent, or Firm* — The Marbury Law Group, PLLC

(57) ABSTRACT

A method for creating a nanostructure according to one embodiment includes depositing material in a template for forming an array of nanocables; removing only a portion of the template such that the template forms an insulating layer between the nanocables; and forming at least one layer over the nanocables. A nanostructure according to one embodiment includes a nanocable having a roughened outer surface and a solid core. A nanostructure according to one embodiment includes an array of nanocables each having a roughened outer surface and a solid core, the roughened outer surface including reflective cavities; and at least one layer formed over the roughened outer surfaces of the nanocables, the at least one layer creating a photovoltaically active p-n junction. Additional systems and methods are also presented.

29 Claims, 9 Drawing Sheets

(51) Int. Cl.
*C23C 28/00* (2006.01)
*C23C 14/34* (2006.01)
*H01L 31/0216* (2014.01)
*B82Y 40/00* (2011.01)
*B82Y 30/00* (2011.01)
*H01L 31/052* (2014.01)
*H01L 31/0352* (2006.01)
*B82Y 10/00* (2011.01)
*H01L 31/18* (2006.01)
*H01L 31/068* (2012.01)

(52) U.S. Cl.
CPC ............... *B82Y 40/00* (2013.01); *Y02E 10/547* (2013.01); *B82Y 30/00* (2013.01); *H01L 31/0527* (2013.01); *Y10S 977/762* (2013.01); *Y10S 977/948* (2013.01); *H01L 31/0352* (2013.01); *H01L 31/0522* (2013.01); *B82Y 10/00* (2013.01); *H01L 31/18* (2013.01); *H01L 31/068* (2013.01); *Y10S 977/891* (2013.01)
USPC .................. 438/94; 438/57; 438/98; 428/400; 428/687; 136/248; 136/252; 136/256; 136/258; 977/762; 977/948; 977/891

(56) References Cited

U.S. PATENT DOCUMENTS

| | | |
|---|---|---|
| RE29,833 E | 11/1978 | Mlavsky |
| 4,234,352 A | 11/1980 | Swanson |
| 4,454,372 A | 6/1984 | Appleby |
| 4,816,082 A | 3/1989 | Guha et al. |
| 5,178,685 A | 1/1993 | Borenstein et al. |
| 5,371,470 A | 12/1994 | Jeng |
| 5,411,897 A | 5/1995 | Harvey et al. |
| 5,476,553 A | 12/1995 | Hanoka et al. |
| 5,916,375 A | 6/1999 | Agui et al. |
| 5,928,439 A | 7/1999 | Ota et al. |
| 6,033,928 A | 3/2000 | Eriguchi et al. |
| 6,087,197 A | 7/2000 | Eriguchi et al. |
| 6,337,283 B1 | 1/2002 | Verlinden et al. |
| 6,372,538 B1 | 4/2002 | Wendt et al. |
| 6,372,980 B1 | 4/2002 | Freundlich |
| 6,383,923 B1 | 5/2002 | Brown et al. |
| 6,423,568 B1 | 7/2002 | Verlinden et al. |
| 6,448,105 B1 | 9/2002 | Sterk |
| 6,518,494 B1 | 2/2003 | Shibuya et al. |
| 6,548,751 B2 | 4/2003 | Sverdrup, Jr. et al. |
| 6,559,479 B1 | 5/2003 | Ludemann |
| 6,583,349 B2 | 6/2003 | Tanaka |
| 6,620,996 B2 | 9/2003 | Sugawara et al. |
| 6,638,823 B2 | 10/2003 | Cho et al. |
| 6,660,930 B1 | 12/2003 | Gonsiorawski |
| 6,852,920 B2 | 2/2005 | Sager et al. |
| 6,872,450 B2 | 3/2005 | Liu et al. |
| 6,872,645 B2 | 3/2005 | Duan et al. |
| 6,878,871 B2 | 4/2005 | Scher et al. |
| 6,882,051 B2 | 4/2005 | Majumdar et al. |
| 6,946,597 B2 | 9/2005 | Sager et al. |
| 7,051,945 B2 | 5/2006 | Empedocles et al. |
| 7,064,372 B2 | 6/2006 | Duan et al. |
| 7,067,867 B2 | 6/2006 | Duan et al. |
| 7,083,104 B1 | 8/2006 | Empedocles et al. |
| 7,135,350 B1 | 11/2006 | Smith et al. |
| 7,253,017 B1 | 8/2007 | Roscheisen et al. |
| 7,589,880 B2 | 9/2009 | Kempa et al. |
| 7,649,665 B2 | 1/2010 | Kempa et al. |
| 7,754,964 B2 | 7/2010 | Kempa et al. |
| 7,847,180 B2 | 12/2010 | Argo et al. |
| 7,943,847 B2 | 5/2011 | Kempa et al. |
| 2002/0011641 A1 | 1/2002 | Oswald et al. |
| 2002/0130311 A1 | 9/2002 | Lieber et al. |
| 2002/0175408 A1 | 11/2002 | Majumdar et al. |
| 2003/0041894 A1* | 3/2003 | Sverdrup et al. ............... 136/251 |
| 2004/0018525 A1 | 1/2004 | Wirtz et al. |
| 2004/0060591 A1 | 4/2004 | Den |
| 2004/0063320 A1 | 4/2004 | Hollars |
| 2004/0075464 A1 | 4/2004 | Samuelson et al. |
| 2004/0123896 A1 | 7/2004 | Lemmon et al. |
| 2004/0144420 A1 | 7/2004 | Takeyama et al. |
| 2004/0144985 A1* | 7/2004 | Zhang et al. .................... 257/79 |
| 2004/0146560 A1 | 7/2004 | Whiteford et al. |
| 2004/0250848 A1* | 12/2004 | Sager et al. ..................... 136/252 |
| 2005/0018525 A1 | 1/2005 | Kim et al. |
| 2005/0040374 A1 | 2/2005 | Chittibabu et al. |
| 2005/0079659 A1 | 4/2005 | Duan et al. |
| 2005/0098204 A1 | 5/2005 | Roscheisen et al. |
| 2005/0098205 A1 | 5/2005 | Roscheisen et al. |
| 2005/0121068 A1 | 6/2005 | Sager et al. |
| 2005/0126628 A1 | 6/2005 | Scher et al. |
| 2005/0161662 A1 | 7/2005 | Majumdar et al. |
| 2005/0181587 A1 | 8/2005 | Duan et al. |
| 2005/0189015 A1 | 9/2005 | Rohatgi et al. |
| 2005/0217717 A1 | 10/2005 | Faris |
| 2005/0224790 A1 | 10/2005 | Jin et al. |
| 2006/0006463 A1 | 1/2006 | Islam et al. |
| 2006/0024438 A1 | 2/2006 | Ku et al. |
| 2006/0038182 A1 | 2/2006 | Rogers et al. |
| 2006/0151820 A1 | 7/2006 | Duan et al. |
| 2006/0207647 A1* | 9/2006 | Tsakalakos et al. .......... 136/256 |
| 2007/0029561 A1 | 2/2007 | Cho et al. |
| 2007/0137697 A1 | 6/2007 | Kempa et al. |
| 2007/0240757 A1 | 10/2007 | Ren et al. |
| 2008/0251122 A1 | 10/2008 | Ready |
| 2009/0250105 A1 | 10/2009 | Lee |
| 2010/0078055 A1 | 4/2010 | Vidu et al. |
| 2010/0112748 A1 | 5/2010 | Vidu et al. |
| 2010/0319759 A1 | 12/2010 | Fisher et al. |
| 2011/0308564 A1 | 12/2011 | Kempa et al. |

FOREIGN PATENT DOCUMENTS

| | | |
|---|---|---|
| EP | 1938391 A2 | 7/2008 |
| EP | 1949451 A2 | 7/2008 |
| JP | 53-31987 | 3/1978 |
| JP | 53-031987 A | 3/1978 |
| JP | 03-151672 A | 6/1991 |
| JP | 06-342924 A | 12/1994 |
| JP | 9-118511 | 5/1997 |
| JP | 11-246300 A | 9/1999 |
| JP | 2005-059125 A | 3/2005 |
| JP | 2005-076039 A | 3/2005 |
| JP | 2006/261666 A2 | 9/2006 |
| JP | 2008/054018 A2 | 3/2008 |
| JP | 2008-532321 A | 8/2008 |
| JP | 2009/507397 T2 | 2/2009 |
| JP | 2009/507398 T2 | 2/2009 |
| WO | WO 2004/044948 A2 | 5/2004 |
| WO | WO 2007/040594 A2 | 4/2007 |
| WO | WO 2008/048232 A2 | 4/2008 |
| WO | WO 2008/048233 A2 | 4/2008 |
| WO | 2010/151556 A1 | 12/2010 |

OTHER PUBLICATIONS

Non-Final Office Action Summary from U.S. Appl. No. 11/466,416 dated Dec. 23, 2010.
Final Office Action Summary from U.S. Appl. No. 11/466,416 dated May 26, 2011.
Restriction/Election Requirement from U.S. Appl. No. 12/508,815 dated Aug. 2, 2011.
U.S. Appl. No. 13/039,208, filed Mar. 2, 2011.
PCT Application No. PCT/US11/27066 filed on Mar. 3, 2011.
U.S. Appl. No. 13/289,979, filed Nov. 4, 2011.
U.S. Appl. No. 13/289,968, filed Nov. 4, 2011.
U.S. Appl. No. 60/710,097, filed Aug. 22, 2005.
U.S. Appl. No. 60/710,262, filed Aug. 22, 2005.
Non-Final Office Action Summary from U.S. Appl. No. 11/466,411 mailed on Jun. 24, 2009.
Non-Final Office Action Summary from U.S. Appl. No. 11/466,411 mailed on Nov. 27, 2009.

(56) References Cited

OTHER PUBLICATIONS

Rumpler II, Joseph J., "Optoelectric Integration Using The Magnetically Assisted Statistical Assembly Technique: Initial Magnetic Charaterization and Process Development," MIT Thesis, 2002 (available online at http://dspace.mit.edu/bitstream/handle/1721.1/32714/51979480.pdf; 102 pages.
Final Office Action Summary from U.S. Appl. No. 11/466,411 mailed on Jun. 8, 2010.
Sharma et al., "Diameter Control of Ti—Catalyzed Silicon Nanowires", © 2004 Elsevier B.V., Journal of Crystal Growth, vol. 267, pp. 613-618.
Non-Final Office Action Summary from U.S. Appl. No. 11/466,411 mailed on Nov. 9, 2009.
Notice of Allowance from U.S. Appl. No. 11/466,411 mailed on Oct. 6, 2010.
Written Opinion and Search Report from PCT Application No. PCT/US06/32987 mailed on Jul. 18, 2008.
International Preliminary Report from PCT Application No. PCT/US06/32987 mailed on Jul. 22, 2009.
Zhang et al., "Coaxial Nanocable: Silicon Carbide and Silicon Oxide Sheathed with Boron Nitride and Carbon," Downloaded from www.sciencemag.org on Jun. 22, 2008, Science, vol. 28, Aug. 14, 1998, p. 973-975.
Gaire et al., "Mechanical Testing of Isolated Amorphous Silicon Slanted Nanorods," © 2005 American Scientific Publishers, Journal of Nanoscience and Nanotechnology, vol. 5, No. 11, p. 1893-1897.
Kayes et al., "Synthesis and Characterization of Silicon Nanorod Arrays for Solar Cell Applications," Cal Tech Disclosure, May 19, 2006, p. 221-224, Hawaii.
Kayes et al., "Comparison of the device physics principles of planar and radial p-n junction nanorod solar cells," © 2005 American Institute of Physics, Journal of Applied Physics, vol. 97, p. 114302-1-114302-11.
Kayes, "Radial P-N Junction Nanorod Solar Cells," Applied Physics Candidacy Presentation, Sep. 7, 2004, p. 1-32.
U.S. Appl. No. 11/466,416, filed Aug. 22, 2006.
Non-Final Office Action Summary from U.S. Appl. No. 11/466,416 mailed on Aug. 5, 2009.
Non-Final Office Action Summary from U.S. Appl. No. 11/466,416 mailed on Dec. 9, 2009.
PeriodicTable.com, Technical Data For Gold, available at http://www.periodictable.com/Elements/079/data.html (last visited Nov. 18, 2009), p. 1-3.
PeriodicTable.com, Technical Data For Tellurium, available at http://www.periodictable.com/Elements/052/data.html (last visited Nov. 18, 2009), p. 1-3.
Encyclopedia Britannica, Shear Modulus, available at http://britannica.com/EBchecked/topic/539275/shear-modules (Downloaded Oct. 22, 2010), 1 page.
Ku et al., "Fabrication of Nanocables by Electrochemical Deposition Inside Metal Nanotubes," © 2004 American Chemical Society. Journal of American Chemical Society, vol. 126, No. 46, p. 15022-15023.
Lebedev et al., "Modeling Electrochemical Deposition inside Nanotubes to Obtain Metal-Semiconductor Multiscale Nanocables or Conical Nanopores," © 2005 American Chemical Society, Journal of Physics Chemistry B, vol. 109, No. 30, Jul. 13, 2005, p. 14523-14528.
Sun et al., "Ag Nanowires Coated with Ag/Pd Alloy Sheaths and Their Use as Substrates for Reversible Absorption and Desorption of Hydrogen," © 2004 American Chemical Society, Journal of American Chemical Society, 2004, vol. 126, No. 19, p. 5940-5941.
PeriodicTable.com, Technical Data For Silver, available at http://www.periodictable.com/Elements/047/data.html (last visited Nov. 18, 2009), p. 1-3.
PeriodicTable.com, Technical Data For Palladium, available at http://www.periodictable.com/Elements/046/data.html (last visited Nov. 18, 2009), p. 1-3.
Final Office Action Summary from U.S. Appl. No. 11/466,416 mailed on May 26, 2010.
Peng et al., "Aligned Single-Crystalline Si Nanowire Arrays for Photovoltaic Applications," © 2005 Wiley-VCH Verlag GmbH & Co., www.small-journal.com, vol. 1, No. 11, p. 1062-1067.
International Search Report and Written Opinion from PCT Application No. PCT/US06/32986 mailed on Sep. 10, 2008.
International Preliminary Report from PCT Application No. PCT/US/06/32986 mailed on Jul. 22, 2009.
Non-Final Office Action Summary from U.S. Appl. No. 11/466,416 dated Feb. 17, 2012.
Kayes et al., "Radial PN Junction Nanorod Solar Cells: Device Physics Principles and Routes to Fabrication in Silicon," Photovoltaic Specialists conference, Aug. 8, 2005.
PCT International Preliminary Report on Patentability from application No. PCT/US2010/039552 dated Jan. 12, 2012.
"Konarka: Vision and Mission" 2011 Konarka Technologies, Inc., www.konarkatech.com/about/, 2 pages.
Glaeser, Andreas M., "Model studies of Rayleigh instabilities via microdesigned interfaces," Lawrence Berkeley National Laboratory, Oct. 17, 2000, 39 pages.
Non-Final Office Action Summary from U.S. Appl. No. 12/508,815 dated Nov. 10, 2011.
Final Office Action Summary from U.S. Appl. No. 12/508,815 dated May 30, 2012.
Darius Snieckus; "A different dimension"; US Solar, innovation; www.rechargenews.com; Feb. 4, 2011.
Office Action issued in Japanese Patent Application No. 2008-540018, mailed on Dec. 4, 2012.
Kuiqing Peng, et al., Aligned Single-Crystalline Si Nanowire Arrays for Photovoltaic Applications [online], Small, 2005, vol. 1, Issue 11, pp. 1062-1067.
Indium Tin Oxide; Material Property Database; http://www.mit.edu/~6.777/matprops/ito.htm; accessed May 14, 2014.
John David Jackson; Professor of Physics, University of Illinois; Classical Electrodynamics; John Wiley & Sons, Inc.1998.
Optical Constants of IN O—SnO (ITO, Indium Tin Oxide); Refractive index of In2O3—SnO2 (ITO, Indium tin oxide) [Crystals etc.]—Refractive Index Info; http://refractiveindex.info/legacy/?group=CRYSTALS&material=ITO; accessed on May 14, 2014.
Optical Constants of ZnO (Zinc Oxide); Refractive index of IZnO (Zinc Oxide) [Crystals etc.]—Refractive Index Info; http://refractiveindex.info/legacy/?group=CRYSTALS&material=ZnO; accessed May 14, 2014.
Jeong-Eun Kim et al.; Electrical and Optical Properties of Zinc Oxide Thin Films Deposited Using Atomic Layers Deposition; Journal of the Korean Ceramic Society; vol. 47, No. 4, pp. 353-356; 2010.

\* cited by examiner

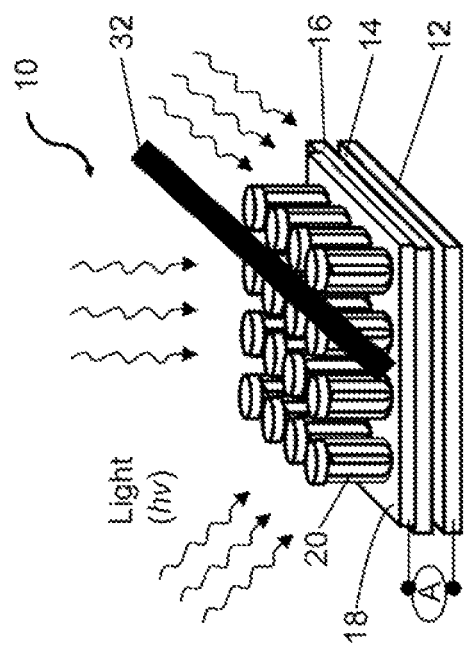

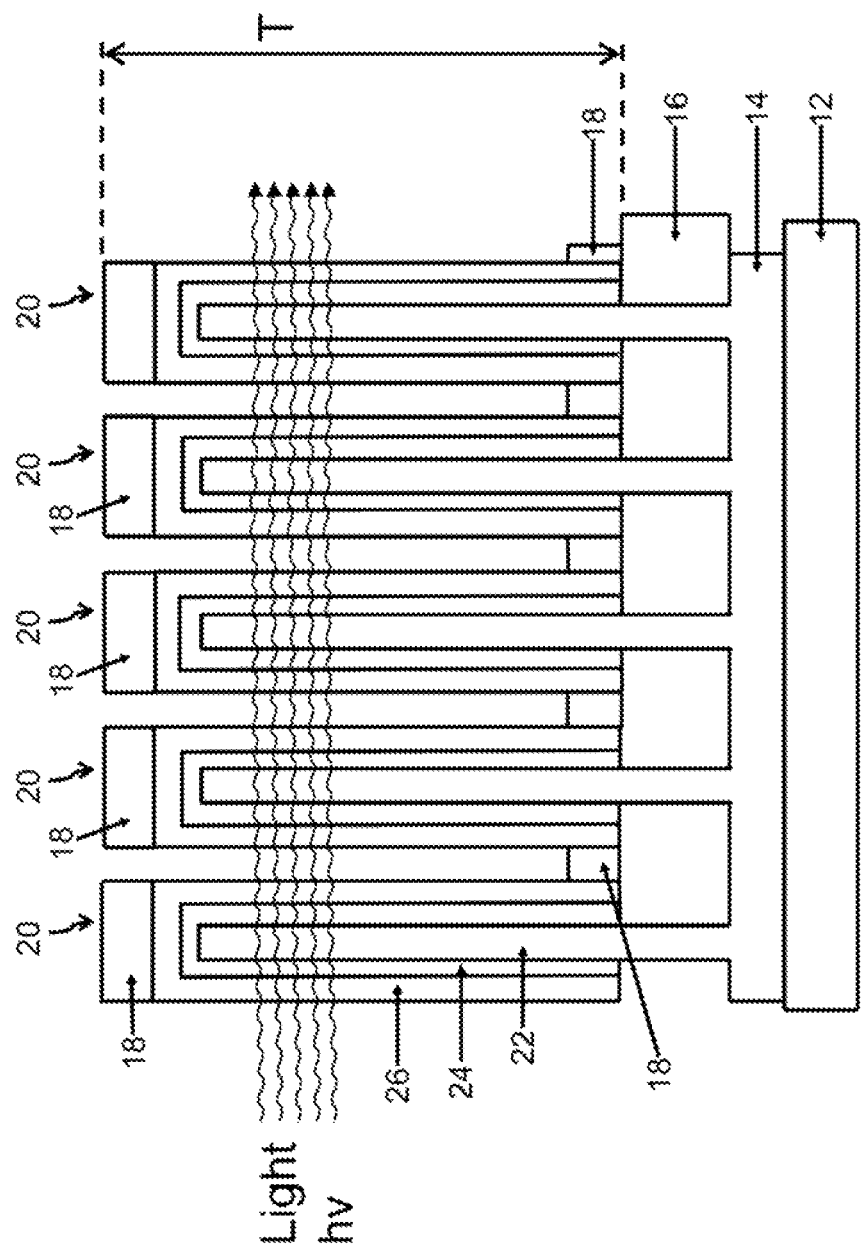

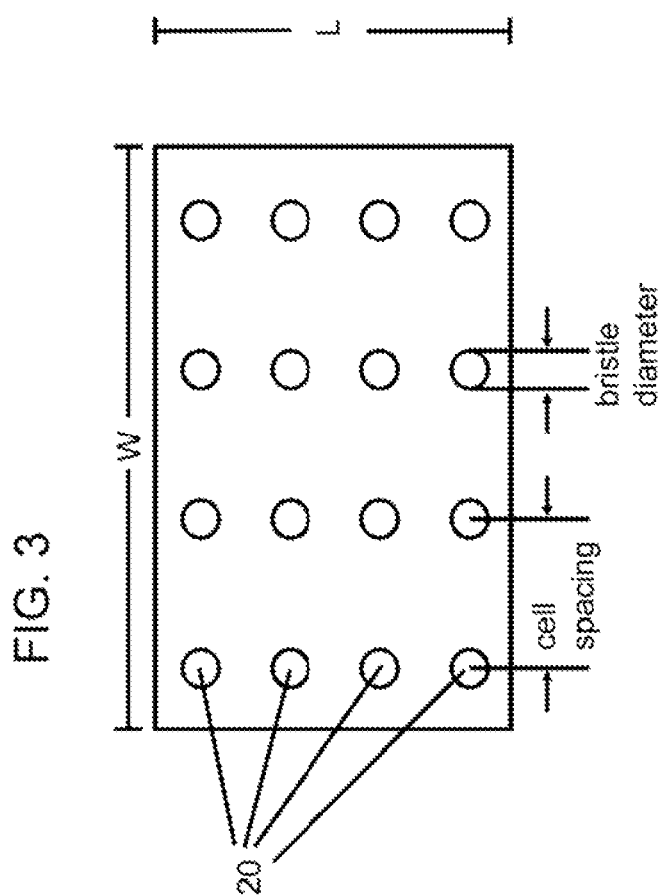

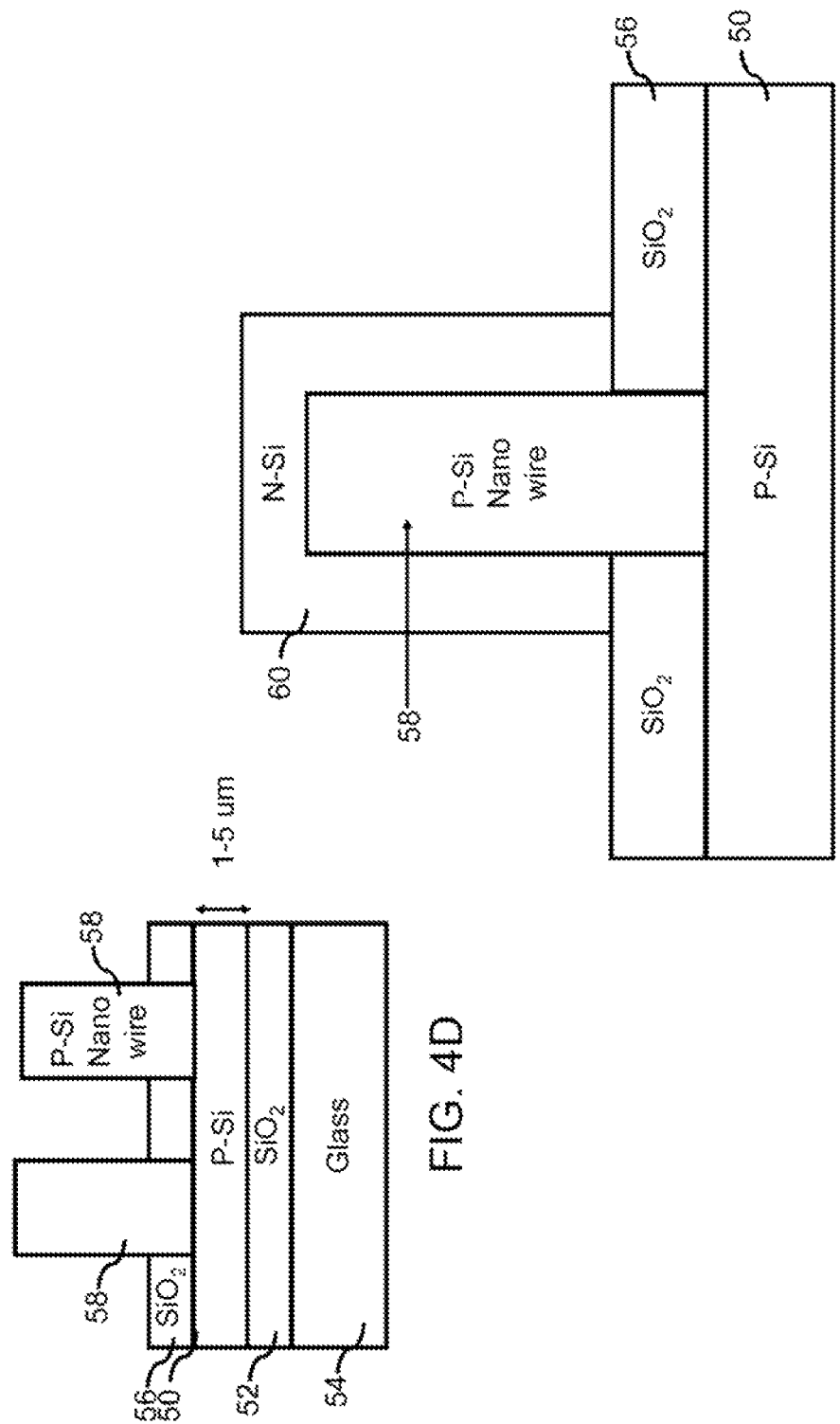

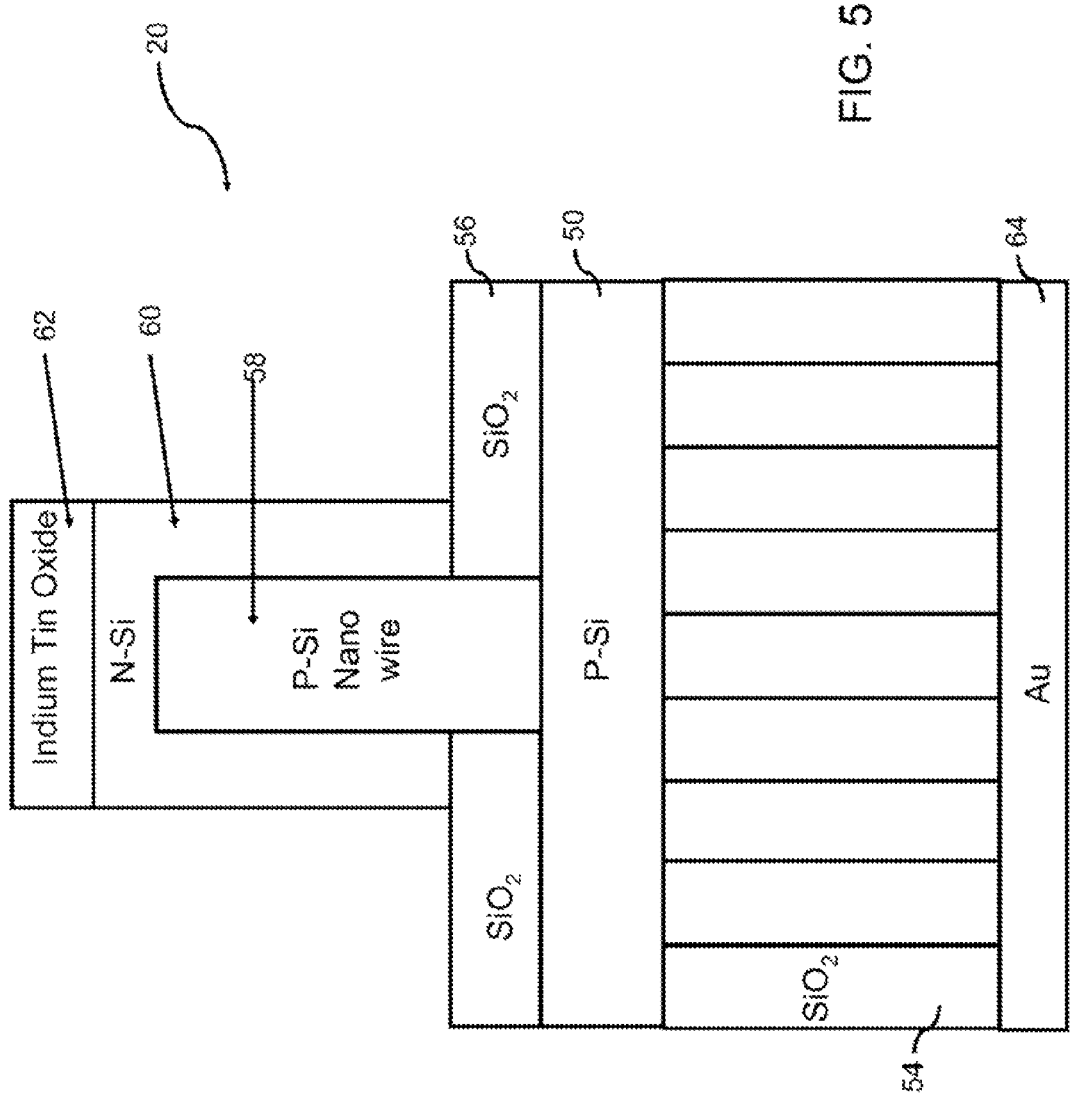

METHODS FOR FORMING NANOSTRUCTURES AND PHOTOVOLTAIC CELLS IMPLEMENTING SAME

RELATED APPLICATIONS

This application is a continuation of U.S. patent application Ser. No. 11/466,411 filed Aug. 22, 2006, which claims priority to U.S. Provisional Patent Application No. 60/710,097 filed Aug. 22, 2005, and also claims priority to U.S. Provisional Patent Application No. 60/710,262 filed Aug. 22, 2005, from all of which priority is claimed and all of which are herein incorporated by reference. This application is related to U.S. patent application Ser. No. 11/466,416 filed Aug. 22, 2006, which is herein incorporated by reference.

FIELD OF INVENTION

This invention pertains generally to nano-scale structures and processes for making nano-scale structures.

BACKGROUND

Solar panels that harness solar energy and convert it to electrical energy are well known. Typically, a solar panel has four basic parts: the photovoltaic (PV) cell, charge controller, battery, and inverter. Of the four parts, the PV cell is a p-n junction diode capable of generating electricity in the presence of sunlight, and is often made of crystalline silicon (e.g., poly-crystalline silicon) that is doped with elements from either group 13 (group III) or group 15 (group V) on the periodic table. When these dopant atoms are added to the silicon, they take the place of silicon atoms in the crystalline lattice and bond with the neighboring silicon atoms in almost the same way as the silicon atom that was originally there. However, because these dopants do not have the same number of valence electrons as silicon atoms, extra electrons or "holes" become present in the crystal lattice. Upon absorbing a photon that carries an energy that is at least the same as the band gap energy of the silicon, the electrons become free. The electrons and holes freely move around within the solid silicon material, making silicon conductive. The closer the absorption event is to the p-n junction, the greater the mobility of the electron-hole pair.

When a photon that has less energy than silicon's band gap energy strikes the crystalline structure, the electrons and holes are not mobilized. Instead of the photon's energy becoming absorbed by the electrons and holes, the difference between the amount of energy carried by the photon and the band gap energy is converted to heat.

While the idea of converting solar energy to electrical power has much appeal, the conventional solar panels have limited usage because their efficiencies are generally only in the range of 15%. This low efficiency is due in part to the planar configuration of current PV cells, as well as the relatively large distances between the electrodes and the P-N junction. Low efficiency means that larger and heavier arrays are needed to obtain a certain amount of electricity, raising the cost of a solar panel and limiting its use to large-scale structures.

The most common material for solar cells is silicon. Crystalline silicon comes in three categories: single-crystal silicon, polycrystalline silicon, and ribbon silicon. Solar cells made with single or monocrystalline wafers have the highest efficiency of the three, at about 20%. Unfortunately, single crystal cells are expensive, and round so they do not completely tile a module. Polycrystalline silicon is made from cast ingots. They are made by filling a large crucible with molten silicon and carefully cooling and solidifying them. The polycrystalline silicon is less expensive than single crystal, but is only about 10-14% efficient depending on the process conditions. Ribbon silicon is the last major category of PV grade silicon. It is formed by drawing flat, thin films from molten silicon, and has a polycrystalline structure. Silicon ribbon's efficiency range of 11-13% is also lower than monocrystalline silicon. Most of these technologies are based on wafers about 300 µm thick. The PV cells are fabricated then soldered together to form a module.

Another technology under development is multijunction solar cells, which is expected to deliver less than 18.5% efficiency in actual use. The process and materials to produce multijunction cells are enormously expensive. Those cells require multiple gallium/indium/arsenide layers. The best to date is believed to be a sextuple-junction cell.

A promising enabler of PV cells and other technology is nanotechnology. However, one problem with implementing nanotechnology is that the minute conductors may not be able to withstand subsequent processing conditions. For example, the metal forming the conductors may melt during high temperature processes such as chemical vapor deposition (CVD).

Thus, as alluded to, the technology available to create PV cells and other electronic structures is limited to some extent by the high cost of fabrication as well as processing limitations.

Therefore, it would be desirable to enable creation of nanostructures having high aspect ratios and yet are able to survive processing such as CVD.

It would also be desirable to enable fabrication of a solar cell that has a higher than average efficiency, and in some embodiments, higher than about 20%.

SUMMARY

A method for creating a nanostructure according to one embodiment includes depositing material in a template for forming an array of nanocables; removing only a portion of the template such that the template forms an insulating layer between the nanocables; and forming at least one layer over the nanocables.

A method for creating a nanostructure according to another embodiment includes depositing material in a template for forming an array of nanocables; removing the template; forming an insulating layer between the nanocables; and forming at least one layer over the nanocables.

A method for creating a nanostructure according to one embodiment includes depositing material in a template for forming an array of pillars; removing the template; forming at least one layer over the pillars such that the pillars are covered by the at least one layer; and depositing a metal contact over the at least one layer such that the at least one layer is covered by the metal contact.

A nanostructure according to one embodiment includes a nanocable having a roughened outer surface and a solid core.

A nanostructure according to one embodiment includes an array of nanocables each having a roughened outer surface and a solid core, the roughened outer surface including reflective cavities; and at least one layer formed over the roughened outer surfaces of the nanocables, the at least one layer creating a photovoltaically active p-n junction.

A method for creating a nanocable with a rough outer surface according to one embodiment includes plating a metal over the surface of a metallic nanocable such that the metal forms an alloy with the nanocable at the surface of the nanocable; and removing the metal from the surface of the nanocable, wherein the outer surface of the nanocable is rough upon removal of the metal.

A method for creating a nanostructure according to one embodiment includes plating a metal over the surface of a metallic nanocable such that the metal forms an alloy with the nanocable at the surface of the nanocable; removing the metal from the surface of the nanocable, wherein the outer surface of the nanocable is rough upon removal of the metal, wherein the roughened outer surface includes at least one of pores and cavities; and forming at least one layer over the rough outer surface, the at least one layer creating a photovoltaically active p-n junction.

A method for creating a nanocable through etching a membrane on a conductor according to one embodiment includes depositing material in a template for forming an array of nanocables; removing the template; forming an insulating layer between the nanocables; and forming at least one layer over the nanocables.

BRIEF DESCRIPTION OF THE DRAWINGS

FIG. 1 is a perspective view of an exemplary solar brush that may be used to implement solar panels with improved efficiency.

FIG. 2 is a side cross-sectional view of an exemplary solar brush.

FIG. 3 is a top view of the solar brush showing the arrangement of the solar brush bristles.

FIGS. 4A-4F illustrate an exemplary method of preparing a solar brush bristle with silicon nanocables.

FIG. 5 is a side cross-sectional view of a bristle with lower resistance.

DETAILED DESCRIPTION OF THE EMBODIMENT(S)

Figure 4C:
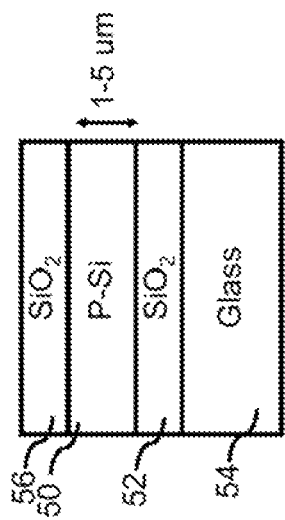

The following description is the best mode presently contemplated for carrying out the present invention. This description is made for the purpose of illustrating the general principles of the present invention and is not meant to limit the inventive concepts claimed herein. Further, particular features described herein can be used in combination with other described features in each and any of the various possible combinations and permutations.

Embodiments of the invention are described herein in the context of solar cells. However, it is to be understood that the solar cell embodiments provided herein are just exemplary applications and the nanocable arrangement of the invention is not limited to the applications or the embodiments disclosed herein.

Thin film approaches are typically module based. The entire module substrate is coated with the desired layers and a laser scribe marks individual cells. This disclosure discloses nano arrays of thin film solar cells. It is important to note that nano systems will be processed differently than current technology thin films. Four main thin film approaches are amorphous silicon, copper indium selenide ($CuInSe_2$ commonly referred to as CIS), and copper indium gallium selenide ($CuIn_xGa_{1-x}Se_x$) commonly referred to as CIGS, and CdTe/CdS.

FIG. 1 is a perspective view of an exemplary solar brush 10 that may be used to implement solar panels with improved efficiency. As shown, the solar brush 10 has a substrate 12, a first conductive layer 14, an insulator layer 16, a second conductive layer 18, and a plurality of bristles 20. Although the bristles 20 are shown to be cylindrically-shaped in the particular embodiment, they may be of any other shape including but not limited to cones, rectangular, domes, or more complex geometries such as branched bristles etc. Each of the bristles 20 has a nanocable extending through its center, and layers of semiconductor around the nanocable. Bristles can be modified to be smooth or hairy. Hair bristles may improve light absorption efficiency by further increasing the surface area or improving internal reflections. Various shapes can be obtained using asymmetric pore membranes. One or more electrically conductive strips 32 may extend across the array or portion thereof to assist in carrying electricity away from the array, thereby improving the overall efficiency of the brush. The efficiency gains are more pronounced in larger arrays. Such strips 32 are preferably very thin to block minimal light.

It should also be noted that though the axes of the bristles 20 are oriented normal (perpendicular) to the plane of the array in the drawings, the axes of the bristles may be tilted slightly (a few degrees from normal) or pronouncedly (e.g., 40-89 degrees). One reason why a tilted configuration may be desirable is to reduce unimpeded penetration of light into the array when the light is traveling in a direction normal to the array.

FIG. 2 is a side cross-section of the solar brush 10 with a metal nanocable. As shown, each of the bristles 20 has a nanocable 22 extending through its core. The nanocable 22 is typically a p-layer conductor, and extends through the insulating layer 16 to electrically connect with the first conductive layer 14. A p-type semiconductive layer 24 of a sufficient thickness surrounds the nanocable 22, and an n-type semiconductive layer 26 of sufficient thickness is coated on the p-type semiconductive layer 24 to create a photovoltaically active p-n junction in each of the bristles 20. An n-layer conductor is deposited on the tops of the bristles 20 and the insulating layer 16 to form the second conductive layer 18.

The closer the photon absorption event is to the p-n junction, the more likely the event will result in usable electricity. In the case of a nanobrush, a reflective back contacting layer is not required because the photon can continue along the linear path so that it can contact the material on the opposite side of the cell thereby achieving a double pass in each nanobristle. In FIG. 2, five cylindrical shell solar brush PV cells are shown. Thus, if the photon passes through the center of the shell it has the potential to come into contact with as many as the equivalent of 10 p-type layers (the layer where the solar event takes place) in this brush design. If the p-layer conductor is sufficiently small most of the photons will pass through the equivalent of five thicker layers. In the actual case, the solar brush, with millions of bristles per $cm^2$, would effectively approach the efficiency of 100% of all usable photon energy.

The substrate 12 may be a conductive material or a non-conductive material (coated with a conductive material), rigid or flexible. For example, the substrate 12 could be glass, doped silicon, metal, polymer, ceramics, diamond, or a variety of composite materials. Thin metal foil or certain polymers can be used where flexibility is desired. Structural integrity of the nanocable will vary with material choices. In the case of brittle or easily deformable bristles, a flexible substrate material could be used if attached to a rigid or semi-rigid surface. The molded surface/flexible membrane may be of particular help when PV cells are desired for an aerodynamic surface such as an airplane part or the roof of a car. In other embodiments, the nanocable is reinforced to provide additional structural integrity, allowing such things as stretchable arrays, deformable and resiliently deformable arrays, etc.

Each of the bristles 20 is a discrete nanoscale photovoltaic cell. Compared to a conventional flat photovoltaic cell design where only a surface is exposed to light, the solar brush 10 has an "xyz" surface area per visible square meter. Thus, for a given volume, the solar brush 10 has a useful surface area that is hundreds or thousands of times greater than the "xy" surface area of conventional flat PV cells. The area between the solar bristles 20 could be sufficiently wide as to make the brush absorptive to the majority of photons. Additionally, the bristles may be thin enough that they are partially transparent. This effective transparency would increase effective energy generation to happen from sunrise to sunset while flat PV cells work optimally when the sun is straight above the PV surface. Because the effective energy generation from the solar brush is expected to be many times higher than conventional PV cell technology, the weight per kilowatt generated would be many times lower. This would allow use in small applications such as charging electronic devices (cell phone, computer, PDA, etc.), use in medium scale applications such as light weight roof-top energy for industrial and agricultural power generation, and use in large applications such as a light weight energy source for transportation (automobile, aircraft, barges). The efficiency of the cell would also enable improved power generation in low light conditions. The wide range of spectrum adsorption may also generate power from infra-red light at night time.

A flexible nanopore substrate can be used as the substrate 12 for deposition of metal. The substrate 12 could be a membrane applied to or constructed on a thin conductive sheet, and may be made into any desired shape. After metal deposition in the membrane pores occurs, the nanocables 22 are formed. While other PV tapes and films have XY flexibility and strength, they are limited and no other technology allows for XYZ design of a rigid or flexible long lasting solar cell. The varied geometry of the solar brush allows the PV cells to be optimized for solar exposure from a fixed location, optimal aesthetic appeal, and minimal aerodynamic drag for transportation applications. Specific geometries combined with reflective substrates can effectively produce a combined PV film and solar concentrator.

There are many combinations of materials that may be used for the solar brush 10. One configuration is to use a Si thin film. Other configurations include CdTe/CdS (CdTe/CdS/SnO$_2$/ITO/glass), GaAs/GaInP, CuInGaSe$_2$, Cu(In$_x$Ga$_{1-x}$)(S,Se)$_2$, CuIn$_{1-x}$Ga$_x$Se$_{1-y}$S$_y$, CGSe/CdS, CuIn$_x$Ga$_{1-x}$Te$_2$/n-InSe, CdS/CIGS interface, ZnS/CIGS, Cu$_2$S—CdS, CuInS$_2$ or a mix of Cu$_x$S, CuInS$_2$ and CuIn$_5$S$_8$, Cu(In,Ga)Se$_2$/CdS, CIS/In$_2$Se$_3$, InN, CIS/In$_2$Se$_3$, ZnS$_x$Se$_{1-x}$. GaInP/GaAs, GaInP/GaAs/Ge, GaAs/CIS, a-Si/CIGS (a-Si is amorphous Si/hydrogen alloy), FeS$_2$, Cu$_2$O, ITO/a-CNx (Al Schottky thin-film carbon nitride solar cells), and MoS$_2$ based solar cells or more general: MX2 (M=Mo, W; X=S, Se) thin films with Ni and Cu additives layers may be used as well. An Al$_2$O$_3$ layer may be used as a diffusion barrier with the CuInGaSe$_2$ type PV cells. The manufacturing step may include heat annealing at high temperatures to allow for the consolidation of polycrystalline deposits to form a single crystal material. Alternatively, single crystalline growth of layers should be favored by slow growth of the layers at moderate temperatures. Single crystalline deposits are important for optimum electron transport and photon absorption.

Deposition of the various materials can include chemical vapor deposition, solution phase deposition, electrochemical deposition, electrochemically induced sol-gel deposition, electrochemical atomic layer epitaxy, electroless deposition, e-beam evaporation, sol-gel with electrophoresis or centrifugation, electron beam lithography, scanned probe lithography, pressure injections, polymerization and electro-polymerization, and pyrolytic decomposition. Nanocables can also be grown from catalyst sites from chemical vapor deposition, wet or dry etched from a substrate, etc.

When designing a PV cell, one of the considerations is the photon flux. The number of photons that make it through the atmosphere at a given point remains relatively constant regardless of modifications in the PV cell that receives them. When determining the appropriate geometry for a PV cell, it is convenient to start by calculating the area of the gaps and the area of the bristle-tops.

FIG. 3 is a top view of the solar brush 10 showing the tops of the bristles 20. Although the bristles 20 are shown to be arranged regularly, this arrangement can be changed to suit the application. The tops of the bristles 20 have a combined area of $A_{top}$ which is calculated as $\pi(D/2)^2 \rho$ wherein D is the diameter of the bristle and $\rho$ is the cable density (number of cables/unit area). The total area ($A_{total}$) of the PV cell is W×L. The area of the gaps between the bristles can then be calculated using the following formula:

$$A_{total} = A_{top} + A_{gap}$$

During the same calculation, it is useful to determine if the spacing for a given cable density is viable for given geometries. Based on the literature, when the diameter of the nanocable 22 ($D_{nanocable}$) is 50 nm, the minimum PV bristle diameter D is about 220 nm. When $D_{nanocable}$=150 nm, the minimum PV bristle optical thickness is about 320 nm. The physical diameter of the bristles 20 will be 50-100 nm larger than the diameter of the nanocable 22, but these numbers should be used for the optical diameter calculations because the outer shell is transparent. The optical diameter is used for calculating the solar efficiency, and the physical diameter is used for determining process limits.

Some publicly available sources disclose the most preferred density ($\rho$) range for nanocables to be:

$$\rho = 10^6 - 10^9 \text{ pores/cm}^2 = 10^{10} - 10^{13} \text{ pores/m}^2$$

when using track etched membranes. When using metal oxide templates the density range shifts to:

$$\rho = 10^8 - 10^{12} \text{ pores/m}^2$$

For the low density case, there is 1 cable per $10^{-10}$ m$^2$, or 1 cable in the center of a $10^{-5} \times 10^{-5}$ m square, so the separation between the centers of cables ("cell spacing") is $10^{-5}$ m or 10000 nm. From that number, the diameter of the bristle (see FIG. 3) is subtracted. The cell spacing is not smaller than the cable diameter and is preferably larger, so cases involving unrealistic physical spacing were eliminated from calculations in Table 1. Optical spacing, S, is given by the following:

$$S = \text{cell spacing} - \text{diameter of a bristle}$$

After Optical spacing is determined, the areas of the top of the PV bristles ($A_{top}$) as well as areas between the bristles ($A_{gap}$) are determined. Table 1 shows that majority of the planar surface area lies within the gaps of the PV cell, not the bristle tops. However, there are design points within the most preferred range that have significant levels of top surface area.

TABLE 1

Planar area calculations for the PV brush.

| $A_{top}$ (m²) | $A_{gap}$ (m²) | ρ (#/cm²) | D (nm) | S (nm) |
|---|---|---|---|---|
| $3.00 \times 10^{-4}$ | 0.9996 | $10^6$ | 220 | 9780 |
| $8.04 \times 10^{-4}$ | 0.9989 | $10^6$ | 370 | 9680 |
| $3.80 \times 10^{-2}$ | 0.9620 | $10^8$ | 220 | 780 |
| $8.04 \times 10^{-2}$ | 0.9892 | $10^8$ | 370 | 680 |
| $1.90 \times 10^{-1}$ | 0.8100 | $5 \times 10^8$ | 220 | 227 |

Planar area and mass per area are crucial to determine back reflection. For planar cells, reflection bounces much of the light out of the PV cell before it has a chance to be absorbed and generate electricity. However, back reflection can benefit the planar cell by bouncing the light off of the back of the cell to give the cell two opportunities to absorb photons from the same stream of light. However, while the back reflection increases the number of absorptive events in the planar cell, it also increases the amount of heat generated per unit volume. In the case of the solar brush 10, only a fraction of the photons that hit the bristle tops can reflect away from the PV cell.

In one embodiment of the solar brush 10, over 96% of the light falls into $A_{gap}$. Several things happen to the light that falls into the gap: (a) the light is absorbed, (b) the light continues straight through the bristle into the next nearest bristle (as shown in FIG. 2), and/or (c) the light is reflected down into the solar brush at an angle of reflection equal to the angle of incidence. In each case, the light from the gap continues into the bristle. The majority of the light is either absorbed or continues straight through the brush. Back reflection is a function of material thickness as well as material type. Because the solar brush is made up of millions of thin bristles, they become nearly "transparent." Thus, in every case except Θ=90° (where Θ is defined as the angle of the sun relative to the plane of the PV cell substrate), back reflection is minimal. If it is assumed that 96% or greater light falls within the gap and each bristle has 90% transparency, then there is a maximum of 0.04% back reflection.

The depth and areas of penetrated light are also calculated. This is a measure of how uniformly the light can be dispersed throughout the PV brush. The penetration of light is governed by the following formula:

$T_{pen}$=penetration thickness=S tan Θ

The thickness or bristle height is related to the maximum penetration. The average penetration for a light stream in many cases would be about Θ/2. However, as Θ approaches 90°, the bottom of the cell could be theoretically flooded with light. However, in reality, this flooding effect is minimal or nonexistent because the light is affected by irregularities in the bristle geometry.

Table 2 shows how deep the light penetrates and what fractional area is used on a first pass by dividing $T_{pen}$ by T, which is the total bristle height. This is a measure of how much the initial light is being diluted. More dilute light leads to lower maximum temperatures or fewer hot spots in the cell, resulting in improved overall efficiency.

TABLE 2

Penetration percentage for a T = 10 μm cell as a function of sun angle above the horizon

| Spacing (nm) | Θ = 10° Penetration (%) | Θ = 45° Penetration (%) | Θ = 80° Penetration (%) | Θ = 90° Penetration (%) |
|---|---|---|---|---|
| 980 | 17.24 | 97.8 | 100 | 100.00 |
| 9680 | 17.07 | 96.8 | 100 | 100.00 |
| 780 | 1.38 | 7.8 | 44.24 | 100.00 |
| 680 | 1.20 | 6.8 | 38.56 | 100.00 |
| 227 | 0.40 | 2.27 | 12.87 | 100.00 |

Penetration percentage for a 100 μm cell as a function of sun angle relative to the plane of the PV cell substrate is simply 10 times lower. The penetration % is an important design criteria. For transparent cables, if there is 10% penetration, the light will have as few as 10 passes through PV cables, and the average photon would have up to 20 passes through the p-n junction since the photon may pass through the p-n junction twice per bristle. It is probably best to set design criteria to target less than 20% for most of the day to insure adequate absorption opportunities for the light stream. When Θ goes to 90°, tan Θ goes to ∞, temporarily making the penetration level 100%. Optimization, however, will be a function of field testing results.

The total PV absorption area is much greater for the sides of the bristles 20 than for the tops. $A_{cell}$ is the surface area available by PV brush which is given by:

$A_{cell} = T(\pi)(D\rho/2)$ where T is the height of the cable, D is the optical diameter of the PV bristle, and ρ is the number of bristles per unit area. The quantity is divided by 2 because it is assumed that most light absorption will come from the sun which is shining on half of the cell at one time. There will be significant absorption events from scattered light as well, but the majority of photons come directly from the sun. Table 3 summarizes some $A_{cell}$ calculations, and shows that the PV cell surface area increases rapidly with denser cell spacing and bristle height. "Cell spacing" is measured from the center of one bristle to the center of its neighboring bristle.

TABLE 3

PV Brush Area Calculations

| Height (μm) | PV Diameter (nm) | Cable Density (#/cm²) | $A_{cell}$ (m² Brush/m² planar) | Cell Spacing (nm) |
|---|---|---|---|---|
| 50 | 220 | $10^6$ | 0.17 | 9780 |
| 100 | 220 | $10^6$ | 0.35 | 9780 |
| 50 | 220 | $10^8$ | 17.28 | 780 |
| 100 | 220 | $10^8$ | 34.56 | 780 |
| 50 | 220 | $5 \times 10^8$ | 86.40 | 227 |
| 100 | 220 | $5 \times 10^8$ | 172.80 | 227 |
| 50 | 320 | $10^6$ | 0.25 | 9680 |
| 100 | 320 | $10^6$ | 0.50 | 9680 |
| 50 | 320 | $10^8$ | 25.13 | 680 |
| 100 | 320 | $10^8$ | 50.27 | 680 |

The penetration area is proportional to the penetration depth, as shown by the following formula:

$A_{pen}$=area initially penetrated by light=$T_{pen}(\pi)(D\rho)$

Where $A_{gap} \gg A_{top}$ the dilution of light is represented by the following formula:

$A_{pen} = T_{pen}/T * A_{total}$

From $A_{pen}$ and $A_{gap}$ (Table 1), a calculation that shows the amount of light dilution that occurs in the cell can be made. The light dilution is important to opportunities for solar absorption events and uniform heating. Wherever there are hot spots there is rapidly degrading conversion efficiency. Wherever there is concentrated light that tends to create hot spots, the ratio of opportunities for an absorption event to the number of photons decreases.

TABLE 4

Dilution levels for PV cells when the sun's angle is at 10°.

| Height (µm) | PV Diameter (nm) | Cable Density (#/cm$^2$) | Cell Spacing (nm) | Dilution (times original area) |
|---|---|---|---|---|
| 50 | 220 | $5 \times 10^8$ | 227 | 15.23 |
| 100 | 220 | $5 \times 10^8$ | 227 | 30.47 |
| 50 | 320 | $10^8$ | 680 | 4.43 |
| 100 | 320 | $10^8$ | 680 | 8.86 |

While the bristle 20 with a metal nanocable 22, such as that shown in FIG. 2, shows good power generation, the nanocable 22 may be fragile if made of a soft metal such as gold or copper. Thus, it may be desirable to reinforce the nanostructures in such embodiments, or use a stronger nanowire.

FIGS. 4A-4F illustrate an exemplary method for preparing a solar brush using silicon-on-insulator (SOI) technology. This method makes a nanocable with a stronger material than typical conductive metals, thereby lending structural support to the nanocable that may be otherwise fragile at high temperatures. Although FIGS. 4A-4F illustrate an example where the nanocable is made of silicon, the nanocable may be also made of other "hard" or robust conductive material such as diamond or metal oxide. The formed nanocables are preferably single-crystal.

Figure 4A:
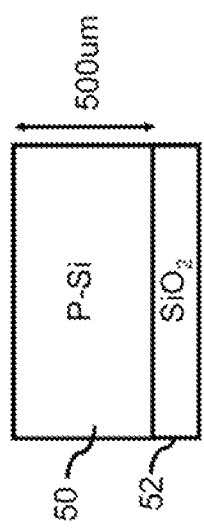
Figure 4B:
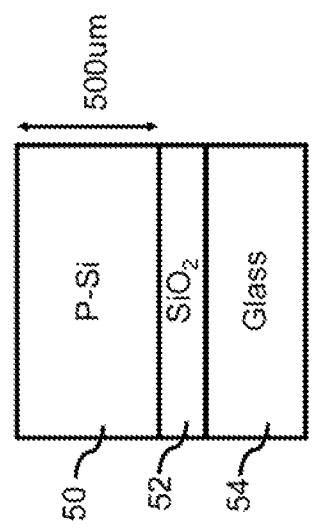

FIG. 4A shows a p-type silicon wafer 50 with a first silicon dioxide layer 52 formed below it. The p-type silicon wafer 50 may be about 500 µm thick, although the invention is not so limited. The first silicon dioxide layer 52 may be thinner than the p-type silicon wafer 50. However, as shown in FIG. 4B, the silicon dioxide layer 52 may be bonded to a thicker substrate such as a piece of glass/quartz 54. The glass/quartz 54 acts as a handle for the SOI structure. In other embodiments, the substrate may be made of a material other than glass/quartz, such as plastic. In further embodiments, the p-type silicon wafer 50 may include discrete sections of p-type material that is coupled to one or a few nanocables of the brush, rather than all nanocables.

As shown in FIG. 4C, the p-type silicon wafer 50 is partially removed, for example by a conventional SOI fabrication technique, so that only a thin layer (e.g., 1-5 µm) of the p-type silicon wafer 50 remains. Then, an optional electrically insulating layer 56, e.g., a second silicon dioxide layer, is grown on the p-type silicon wafer 50 such that the p-type silicon wafer 50 is sandwiched between the first and second silicon dioxide layers 52, 56. The second silicon dioxide layer 56 may be formed using any suitable process, such as by using, for example, thermal oxidation, plasma enhanced chemical vapor deposition (PE-CVD), or thermal oxidation of sites created by Rayleigh instabilities ("Rayleigh sites"). Rayleigh sites are known in the art, and may be developed, e.g., through the methods outlined in an article titled "Rayleigh Instabilities via Microdesigned Interfaces" written by Andreas M. Glaeser and published in *Interface Science* vol. 9, pp. 65-82 (2001), which is herein incorporated by reference.

FIG. 4D shows that holes are formed through the second silicon dioxide layer 56 using, for example, imprinting lithography, etching, etc. Then, p-silicon nanocables 58 (also referred to as p-silicon nanowires) are grown to extend through the holes, so that they become taller than the second silicon dioxide layer 56, and preferably are elongated, i.e., have a longer axial length than width or diameter. The p-type silicon wafer 50 acts as an electrode for the nanocables 58.

One reason that silicon is used to form the nanocables 58 rather than a metal such as copper and gold in this embodiment is that the silicon is able to withstand high temperature processing. The inventors have found that because of the high cost of materials such as gold, In, Te, and S, it may be desirable to form layers of such materials by electroplating so that less material is wasted, as compared to other processes such as CVD, sputtering, etc. which deposit material throughout the chamber as opposed to directly on the surface of interest. However, to plate, a seed layer is typically required. To deposit the seed layer, CVD may be used. The silicon nanocables are able to withstand the high temperatures associated with CVD. Electroplating may also be used to develop silicone nanocables.

The inventors have also found that CVD has a much smaller defect rate than plating, and so it may be desirable to form some layers entirely by CVD. Again, the silicon nanocables are able to withstand the high temperatures associated with CVD.

Several methods for forming the silicon nanocables 58 are contemplated. One illustrative method uses CVD with a seed layer, e.g., of gold. Gold is deposited on the $SiO_2$ substrate 52. Then an insulating layer 56 is deposited. Holes are formed in the insulating layer, and the nanocables 58 are formed through the holes using CVD. Subsequent processing steps may then use CVD.

Another illustrative method proceeds as in the previous paragraph, except that once the nanocables are formed, metal is electroplated thereon to make them stronger.

In yet another illustrative method, the nanocables are integrally formed from the p-silicon wafer 50. Nanowire caps are imprinted on a p-silicon wafer. Material is etched from the p-silicon layer everywhere except under the caps, thereby forming nanowires. CVD, plating, etc. may then be performed over the newly formed nanowires to form the p-n junction and overlying conductor. In a variation, the method is similar except that the nanowire is coated with a p-layer and an n-layer using CVD.

In a further variation, metal can be evaporated onto the surface of Si nanocables, and PV materials can be electroplated thereon.

The nanocables 58 may be spaced apart by any desired distance. In an exemplary embodiment, each of the nanocables 58 is about 100 nm in diameter, about 5 µm to hundreds of µm in height, and are spaced about 200 nm apart (center to center spacing as shown in FIG. 3).

FIG. 4E shows that an n-type silicon layer 60 is deposited over the nanocables 58 to form a p-n junction. The n-type silicon layer 60 may be deposited, for example, by using uncatalyzed growth by chemical vapor deposition. Amorphous silicone films may also be fabricated using PE-CVD. The first silicon dioxide layer 52 and the glass/quartz 54 are omitted from FIG. 4E.

Figure 4F:
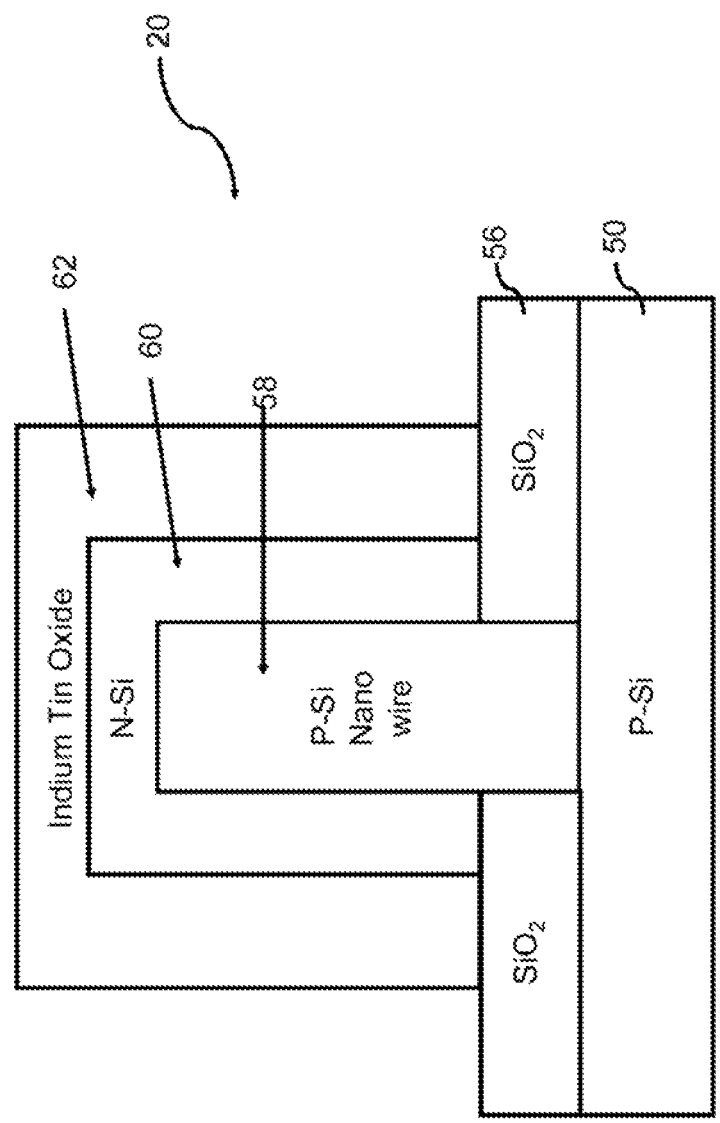

FIG. 4F shows that a layer of substantially transparent electrically conductive material such as indium tin oxide (ITO) is deposited over the n-type silicon 60 to form a substantially transparent electrode layer 62. When initially formed, the transparent electrode layer 62 is deposited over the wafer as a blanket layer, connecting all the n-type silicon layers 60 to one another and touching the second silicon dioxide layer 56 between the nanocables 58. To complete the circuit, another electrode may be connected to a side of the p-type silicon layer 50.

Compared to the traditional flat, bulk-silicon solar panels, the structure of FIG. 4F has much more surface area for light absorption. For example, a traditional, flat solar panel that is 1 cm×1 cm piece of silicon has 1 cm$^2$ of surface area for light absorption. In comparison, 200-nm nanocable cores formed on a 1 cm$^2$ area of silicon separated by about 200 nm with a height of 4 μm would have a light-absorption area of approximately 16 cm$^2$. This dramatic increase in the light-absorption area leads to significant efficiency enhancement.

The structure of FIG. 4F (and FIGS. 5 and 6) also provides a benefit over planar cells in terms of reliability. On planar cells, one defect might short out an entire group of cells. In contrast, one defectively plated nanocable 58 does not affect the performance of its neighbors because it is electrically isolated from the neighbors by the insulating layer 56. Thus, some embodiments of the present invention enable the reliable use of electroplating to form nanostructures. Again, electroplating is much more efficient in terms of conserving rare metals.

If the structure of FIG. 4F were to have a problem of high resistance through the nanocable, steps are available to mitigate this problem. For example, carriers at the p-n junction travel through the nanocable 58 and through the p-type silicon layer 50 until it finds an electrode. This traveling of the carriers causes significant loss of power due to heat.

It should be understood that in the foregoing and other embodiments described herein, the p- and n-character of the components may be reversed. For instance, a nanocable may be formed of n-silicon while the complementary overlayer may be formed of p-silicon.

It should also be understood that additional layers may be added or removed from any of the embodiments described herein, and that the various parts of the embodiments may be combined to create various combination and permutations without straying from the spirit and scope of the present invention.

FIG. 5 shows a nanocable structure (e.g., the bristle 20 of a solar cell) that is designed to overcome or at least mitigate the problem of high resistance. Holes are created in the first silicon dioxide layer 52 and the glass/quartz 54 and filled with a conductive material to create an electrically conductive via, decreasing the distance carriers have to travel to reach a second electrode 64. The material that the second electrode 64 is made of (in this example, gold) may be used to fill these holes that extend through the glass/quartz 54. The transparent electrode layer 62 may also be partially removed (e.g., by etching) to leave a portion at the top of the n-type silicon layer 60 without all the n-type silicon layers 60 being electrically coupled to one another.

Figure 6:
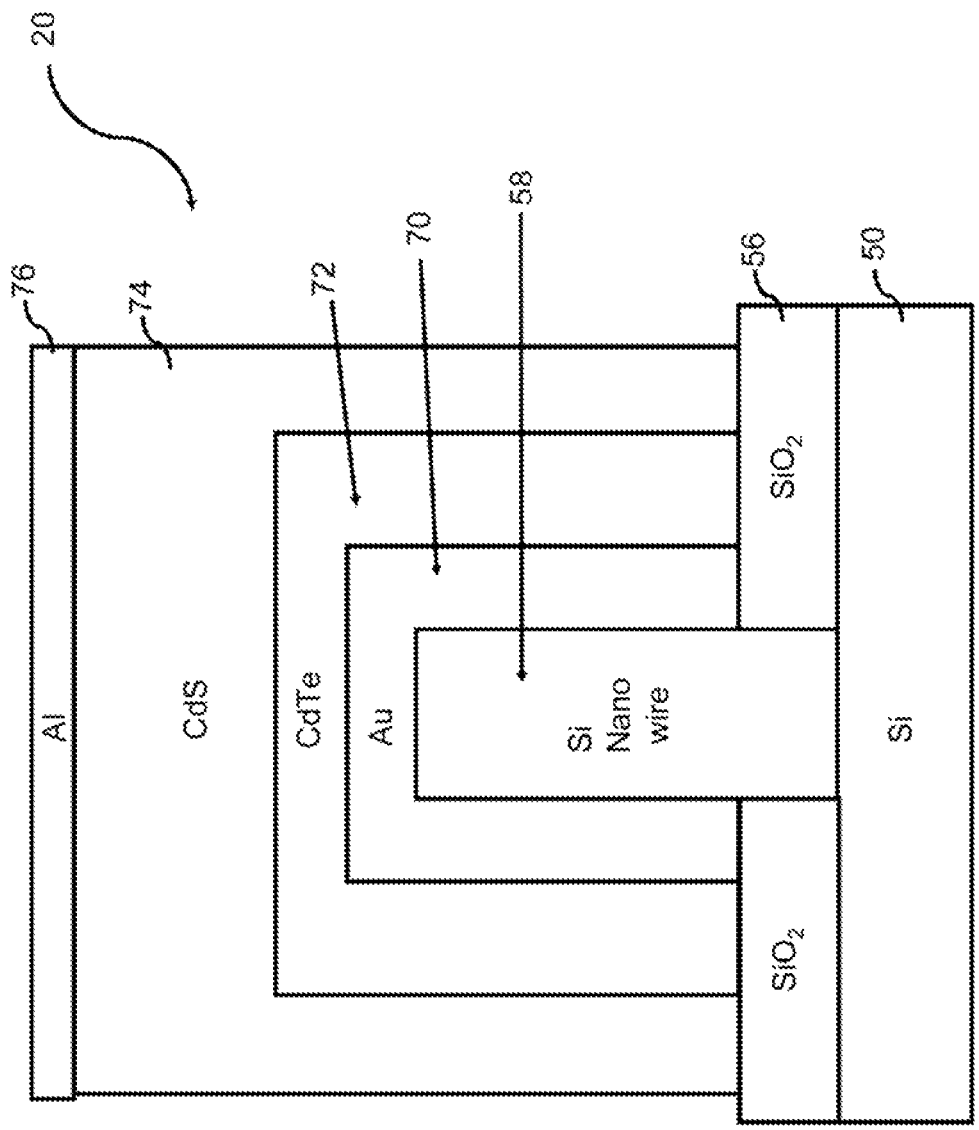
FIG. 6 is a side cross-sectional view of an alternative embodiment of a bristle having CdTe/CdS p-n junction.

FIG. 6 shows an alternative nanocable structure (such as the bristle 20) that includes a nanocable 58 that is grown through lithographically-formed holes in the silicon dioxide layer, as described above. Unlike the structure shown in FIG. 4F or FIG. 5, however, this alternative nanocable structure has an optional conductive layer 70 e.g., of gold, and p- and n-layers 72, 74, which may be a CdTe layer 72 and a CdS layer 74, deposited over the nanocable 58. The CdTe layer 72 and the CdS layer 74 form the p-n junction needed to generate current flow. An aluminum electrode 76 is formed over the CdS layer 74 and partially removed so that it forms a separate electrical contact for each nanocable. This alternative nanocable structure has significantly lower resistance than the structures of FIG. 4F and FIG. 5. Due to the gold layer 70 formed around the nanocable 58, carriers do not need to travel through the entire nanocable.

The bristles of FIG. 6 may be processed to form a variety of photovoltaic devices. If the gold layer 70 has a thickness equal to or less than 100 Å, the gold layer 70 is mostly transparent to visible light. If p-type silicon is used, the nanocables maintain excellent transparency throughout the structure. If the nanocable core is made of metal, most of the nanocable remains transparent with only the nanocable core being reflective. However, the reflective nature of the nanocable core does not dramatically affect the overall performance of the solar brush or the photovoltaic device, as most photons pass through the nanocable without hitting the core. Furthermore, even if a reflection does occur, majority of the photons are reflected deeper into the solar brush.

In an enhanced method, Si or polysilicon is grown on a substrate (e.g. of glass) and uses electric-field-assisted directional growth of silicon nanocable on Si or polysilicon. The growth of the silicon nanocable may not be directional, in which case the electric field will help align the nanocables.

The p-type silicon wafer 50 that was partially removed between FIG. 4B and FIG. 4C can be "recycled" for another process. Thus, multiple solar brushes may be formed from a single p-type silicon wafer 50.

Power generation is a function of average power per day. The median sun hours for various cities in California is 6.18 kW/(day*m$^2$) according to a Go Solar® Company web page at www.solarexpert.com/Pvinsolation.html. On average, solar energy is drawn from about 6 hours per day based on the data made publicly available by National Renewable Energy laboratory findings. The distribution is commonly given as a Gaussian curve, which has the following distribution:

$$f(x) = \frac{e^{\left(\frac{-(x-\mu)^2}{2\sigma^2}\right)}}{\sigma\sqrt{2\pi}}$$

Figure 7:
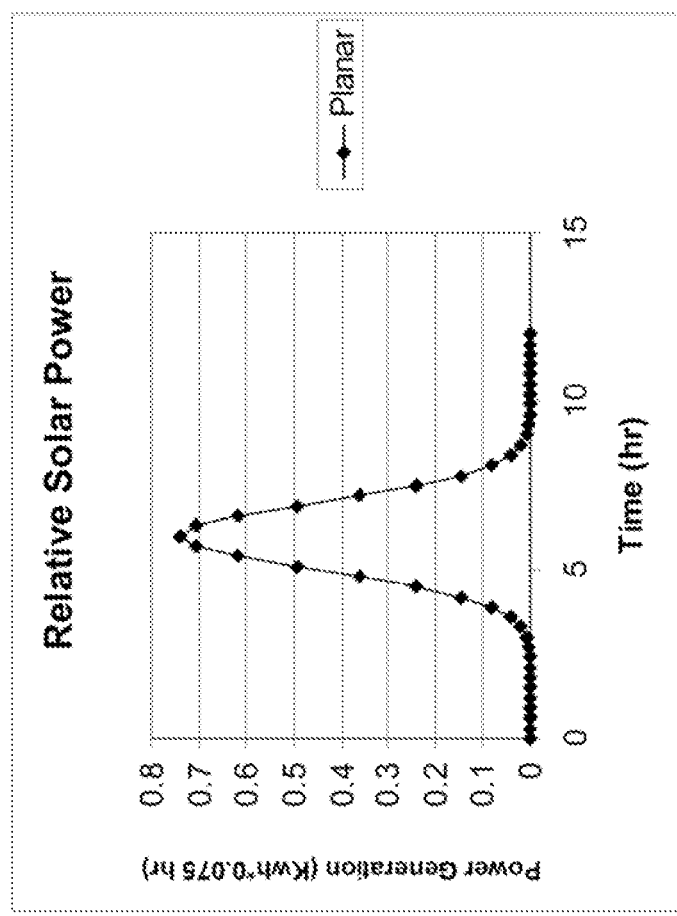
FIG. 7 is a graph showing potential power generation for a planar solar cell.

Assuming an average of μ=6 hours, a standard deviation of σ=1 hour, and integrated power of 6.18 kwh/m$^2$ for an average day gives a maximum energy. When x=μ, the theoretical maximum power generated is about 4.933 kWh/m$^2$. Based on EU studies of layering, the importance of having each solar event near the p-n junction, and reduced hot spots, the CdTe system may approach its theoretical efficiency limit. Efficiency could get as high as 30% with the single layer systems and potentially higher if we combined a high and low band gap system (discussed later). The distributions are shown in FIG. 7.

The power calculation works out as follows:

$P$=6.18 kWh/($m^2$×$d$) from the mean values for a California city $P_{Brush} = P \times E \times O$ Thus, where E=29 (29% efficiency) for a CdTe/CdS PV cell and O=the orientation gain 1.44 (44% gain), $P_{Brush}$=2.60 kWhr/($m^2$×d) (average day in the mean city in CA). However, it should be noted that the brush can pick up about a 44.8% gain in efficiency by adjusting the orientation. The orientation of the solar brush 10 may have a large effect on performance. Planar PV modules lose up to 44% power from poor orientation and often need to be reoriented using a "solar compass". Due to its unique design, the solar brush 10 does not require reorientation.

A majority of the light from the sun is scattered from the atmosphere. Collecting scattered light using the solar brush 10 should lead to even higher energy production. Further energy gains from multi-junction solar cells may bump the efficiency to double what is currently believed to be possible.

The solar brush 10 will probably approach the theoretical maximum efficiency for a given material. Because the brush can be made nearly transparent, most of the light continues to travel through the cell. For practical purposes, the brush would appear to be of ∞ thickness. Because the bristles can be designed just thick enough for stable solar absorption, each absorptive event would happen near the p-n junction. The occurrence of the absorptive event near the p-n junction improves cell efficiency.

Another key to improving cell efficiency is to reduce localized heating. Each time there is solar absorption, part of the energy ejects the electron and part of the energy heats the cell. The heating reduces the efficiency of the cell. When cells rely on back reflection, they are also doubling the heat load for a given areas. As the sun moves across the sky, the penetration angle is changing and the trajectory of the solar stream is changing so there is a greater quantity of "fresh" material for the photons to impact. With the solar brush 10, more of the absorption events can be made to occur near the p-n junction through control of the layer thicknesses, and the light stream will pass through greater amounts of PV material. Multiple junction material is believed to be the key to maximum efficiency in the future. Table 5 shows the efficiency potential, band gap, and field efficiencies for several materials.

TABLE 5

Efficiencies of photovoltaic material

| Material | Theoretical Maximum Efficiency (%) | Laboratory Maximum Efficiency (%) | Field Efficiency (%) | Band Gap (eV) |
|---|---|---|---|---|
| Single Crystal SI | 27 | 23.5 | 14.0-17.0 | 1.1 |
| Si HIT single crystal | 27 | 21.0 | 15.5-16.5 | 1.1 |
| Si Poly Crystal | 27 | 20.0 | 11.5-14.2 | 1.1 |
| Si Ribbon | 27 | 17 | 11.0-13.0 | 1.1 |
| CIS | 24 | 18 | 9.0-11.5 | 0.9 |
| GaAs | 30 | | | 1.4 |
| CdTe | 29 | 17 | 8.0-10.0 | 1.5 |
| Amorphous Si | 25 | 13.0 | 5.0-9.5 | 1.7 |
| Indium Gallium Nitride | 31* | 17 | 8.5-11.05 | 0.8 |
| Graetzel | 20* | 10.9 | 45 | |
| Polymer | 9* | 4.9 | 1.0-2.5 | |

*indicates that the value is an estimate.

The efficiency compares favorably with current technologies to give the maximum power increases. Table 6 shows the potential energy efficiency and power generation capability in the state of California.

TABLE 6

Potential energy efficiency and power generation in California

| Material | Efficiency | kW * hr/Day/m² |
|---|---|---|
| PV Brush (CdTe) | ~29 | 2.60 |
| Single Crystal Si | 17 | 1.19 |
| Polymer | 2.0 | 0.11 |

Power generation and effective areas for the brush can be significantly boosted through the use of a solar concentrator. A solar concentrator could redirect large areas of light perpendicular to the surface, thereby utilizing the surface area at the depths of the brush. The penetration depth shown by FIG. 1 is the spacing distance between bristles times tan $\Theta$. As $\Theta$ approaches 90°, tan $\Theta$ approaches ∞ and the required penetration level is achieved. The effective area of the solar cell is calculated by dividing the penetration dept by the bristle height and multiplying it by the area. The power output of a high efficiency, high area solar cell in one embodiment is between 50 and 285 kW/day/m² with a solar concentrator. The output ranges compare favorably with the maximum output of 0.94 kW/day/m² based on the best known field results for single silicon PV arrays that are produced with a process which is much more costly than the methods and structures presented herein As a comparative example, Konarka uses a technology where printed polymers generate energy from all visible spectra. As described in http://www.konarkatech.com/about/, PV polymers are printed on polymer sheets. Materials are produced by injecting a dye into titanium dioxide and printing the material on to polymers. The Konarka technology is expected to yield 10% efficiency and last about 8 years. In comparison, the materials disclosed herein that are used for the solar brush 10 have a lifespan in the 25 to 30 year time frame. Konarka's process may be less expensive than the solar brush 10 but produces PV cells of only around 2% efficiency. Furthermore, these PV cells would not have a form that is compatible with concentrators. Therefore, the maximum power Konarka's PV film would expect to generate on a given day would be about 0.11 kW/m², while the brush could generate between 450 and 2500 times the power that the Konarka system generates.

Table 7 illustrates the power generation for 8" disk PV cells. Reference is made to Table 3, above, for definitions of column headings.

TABLE 7

High efficiency solar cell power generation for 8" disk PV cells.

| Bristle Height (μm) | Bristle Diameter (nm) | Cable Density (#/m²) | Area (m²/m² planar) | Estimated High Efficiency Power Generation (kWhr/m² * day) |
|---|---|---|---|---|
| 50 | 220 | 5 × 10¹² | 172.76 | 48.06 |
| 100 | 220 | 5 × 10¹² | 345.52 | 96.12 |
| 50 | 370 | 1 × 10¹² | 50.26 | 13.98 |
| 100 | 370 | 1 × 10¹² | 100.54 | 27.96 |

Solar brushes 10 may be made from disks of 11" diameter, or can be grown to any dimension using oxide templates. They could leverage existing photolithography and sputtering machines. If an 8" diameter disk is used, it would generate the equivalent of 0.97 to 5.58 m² of power from a planar cell made of the same material. If a perfect reflector were used in the solar collector, the minimum dish size would range from a diameter of 1.1 m to 14.8 m for full utilization of the PV cell area. Because perfect reflectors do not exist, some of the energy would be lost to absorption and misdirected reflections. A 2 to 25 m diameter may be used to generate the maximum energy. Smaller units can be produced if desired, the size being a function of the power requirements and the installation location. The 8" disk could generate 1.6 to 24.42 kW/day depending on the final area of material on a disk. The system is also preferably sized to allow proper current conduction without undue system heating of the substrate metal.

The small disk size will allow easy cleaning and reduce efficiency losses over time. Since the area of the central disk is so small, it may be designed to snap in and out to be cleaned in a way that is impractical for larger cells.

The wide range of methods to form nanocables on either flexible or rigid substrate that is shaped to a given specification then hardened impacts the efficiency of the film.

Hard coatings such as TiN, ZrN, of HfN that have melting points around 3000° C. may be used for certain layers to minimize reflectance or reinforce the nanocables to increase their hardness.

A coolant may be used to cool the system.

In one embodiment, a method for creating a nanostructure includes depositing material in a template for forming an array of nanocables; removing only a portion of the template such that the template forms an insulating layer between the nanocables; and forming at least one layer over the nanocables.

In some approaches, the at least one layer creates a photovoltaically active p-n junction.

The at least one layer may be formed, e.g., by electroplating, chemical vapor deposition, and/or sputtering. In one embodiment, forming the at least one layer over the nanocables includes sputtering a layer of CIS, CIGS, or CdTe/CdS over the nanocables.

A method for creating a nanostructure according to another embodiment includes depositing material in a template for forming an array of nanocables; removing the template; forming an insulating layer between the nanocables; and forming at least one layer over the nanocables.

In one approach, the at least one layer is formed by electroplating. In another approach, the at least one layer is formed by chemical vapor deposition, and further comprising the step of etching to expose the insulating layer. In a further approach, forming the at least one layer over the nanocables includes sputtering a layer of CIS, CIGS, or CdTe/CdS over the nanocables. Preferably, the at least one layer creates a photovoltaically active p-n junction.

A method for creating a nanostructure according to one embodiment includes depositing material in a template for forming an array of pillars; removing the template; forming at least one layer over the pillars such that the pillars are covered by the at least one layer; and depositing a metal contact over the at least one layer such that the at least one layer is covered by the metal contact. In one approach, the at least one layer creates a photovoltaically active p-n junction.

In one approach, a template material is applied to a substrate, and removing portions of the material are selectively removed for creating the template. For example, the template material may initially be a substantially pure metal, where the selectively removing portions of the material includes oxidizing the substantially pure metal.

In one approach, the material is deposited in the template using sol gel deposition.

In one approach, forming the at least one layer over the pillars includes sputtering a layer of CIS, CIGS, or CdTe/CdS over the pillars.

A nanostructure according to one embodiment includes a nanocable having a roughened outer surface and a solid core.

In one approach, the roughened outer surface includes pores. In another approach, the roughened outer surface includes cavities. In a further approach, the roughened outer surface is reflective.

In one embodiment, the core is formed of a metal. In one approach, the core is selected from a group consisting of gold, silver and platinum.

In one approach, the nanocable has a surface area that is at least ten times an outer surface area of a smooth solid cylinder having identical average dimensions as the nanocable.

In one embodiment, at least one layer is formed over the roughened outer surface, the at least one layer creating a photovoltaically active p-n junction.

A nanostructure according to one embodiment includes an array of nanocables each having a roughened outer surface and a solid core, the roughened outer surface including reflective cavities; and at least one layer formed over the roughened outer surfaces of the nanocables, the at least one layer creating a photovoltaically active p-n junction.

In one embodiment, the core is formed of a metal. In one approach, the core is selected from a group consisting of gold, silver and platinum.

In one approach, each nanocable has a surface area that is at least ten times an outer surface area of a smooth solid cylinder having identical average dimensions as the nanocable.

A method for creating a nanocable with a rough outer surface according to one embodiment includes plating a metal over the surface of a metallic nanocable such that the metal forms an alloy with the nanocable at the surface of the nanocable; and removing the metal from the surface of the nanocable, wherein the outer surface of the nanocable is rough upon removal of the metal.

In one approach, the metal is plated at a potential in an under-potential deposition region, wherein the metal is removed at least in part by switching the potential to a relatively more positive value.

In another approach, the metal is removed at least in part by exposure to a corrosive material.

In one approach, the roughened outer surface includes pores. In another approach, the roughened outer surface includes cavities. In a further approach, the roughened outer surface is reflective.

In one embodiment, the nanocable is formed of a material selected from a group consisting of gold, silver and platinum.

In one approach, the surface area of the nanocable after removing the metal is at least ten times an outer surface area of the nanocable prior to plating the metal.

In one approach, at least one layer is formed over the rough outer surface, the at least one layer creating a photovoltaically active p-n junction.

A method for creating a nanostructure according to one embodiment includes plating a metal over the surface of a metallic nanocable such that the metal forms an alloy with the nanocable at the surface of the nanocable; removing the metal from the surface of the nanocable, wherein the outer surface of the nanocable is rough upon removal of the metal, wherein the roughened outer surface includes at least one of pores and cavities; and forming at least one layer over the rough outer surface, the at least one layer creating a photovoltaically active p-n junction.

In one approach, the metal may be plated at a potential in an under-potential deposition region, wherein the metal is removed at least in part by switching the potential to a relatively more positive value. In another approach, the metal is removed at least in part by exposure to a corrosive material. In a further approach, the surface area of the nanocable after removing the metal is at least ten times an outer surface area of the nanocable prior to plating the metal.

A method for creating a nanocable through etching a membrane on a conductor according to one embodiment includes depositing material in a template for forming an array of nanocables; removing the template; forming an insulating layer between the nanocables; and forming at least one layer over the nanocables.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for creating a nanostructure, comprising:
   depositing a first material to at least partially fill spaces in a template of a second material thereby forming an array of nanocables comprising the first material, wherein the first material is a conductive metallic material;
   removing at least a portion of the second material such that any remaining portion of the second material forms an insulating layer between each nanocable within the array of nanocables; and
   forming at least one layer over the nanocables, wherein the at least one layer forms a respective photovoltaically active p-n junction over each one of the nanocables in the array of nanocables,
   wherein the nanocables are arranged in a brush configuration wherein each one of the nanocables in the array of nanocables extends along a first direction and is spaced apart from the other ones of the nanocables in the array of nanocables in a second direction transverse to the first direction.

2. A method for creating a nanostructure, comprising:
   depositing a first material to at least partially fill spaces in a template of a second material thereby forming an array of nanocables comprising the first material;
   removing only a portion of the second material such that the second material forms an insulating layer partially along the sides and between each nanocable within the array of nanocables; and
   forming at least one layer over the nanocables, wherein the at least one layer forms a respective photovoltaically active p-n junction over each one of the nanocables in the array of nanocables,
   wherein the at least one layer is formed by electroplating, and
   wherein the nanocables are arranged in a brush configuration wherein each one of the nanocables in the array of nanocables extends along a first direction and is spaced apart from the other ones of the nanocables in the array of nanocables in a second direction transverse to the first direction.

3. The method as recited in claim 1, wherein the at least one layer is formed by chemical vapor deposition.

4. The method as recited in claim 1, wherein forming the at least one layer over the nanocables includes sputtering a layer of CIS, CIGS, or CdTe/CdS over the nanocables.

5. The method as recited in claim 1, further comprising forming an insulating layer between the nanocables.

6. The method as recited in claim 2, further comprising forming an insulating layer between the nanocables.

7. The method as recited in claim 1, wherein one of the at least one layer is formed by electroplating.

8. The method as recited in claim 1, wherein the depositing the material in the template includes electroplating.

9. A method for creating a nanostructure, comprising:
   depositing a first material comprising amorphous silicon to at least partially fill spaces in a template of a second material thereby forming an array of nanocables comprising the first material;
   removing only a portion of the second material such that the second material forms an insulating layer partially along the sides and between each nanocables within the array of nanocables; and
   forming at least one layer over the nanocables and the insulating layer, wherein the at least one layer forms a respective photovoltaically active p-n junction over each one of the nanocables in the array of nanocables,
   wherein the nanocables are arranged in a brush configuration wherein each one of the nanocables in the array of nanocables extends along a first direction and is spaced apart from the other ones of the nanocables in the array of nanocables in a second direction transverse to the first direction.

10. The method as recited in claim 9, wherein the at least one layer is formed by electroplating.

11. The method as recited in claim 9, wherein the at least one layer is formed by chemical vapor deposition.

12. The method as recited in claim 9, wherein forming the at least one layer over the nanocables-includes forming a layer of CIS, CIGS, or CdTe/CdS over the nanocables.

13. The method as recited in claim 9, further comprising adding a metal contact over the at least one layer such that the at least one layer is covered by the metal contact.

14. The method as recited in claim 1, further comprising adding a metal contact over the at least one layer such that the at least one layer is covered by the metal contact.

15. The method as recited in claim 2, further comprising adding a metal contact over the at least one layer such that the at least one layer is covered by the metal contact.

16. The method as recited in claim 1, further comprising forming a metal over the surface of the metallic nanocables such that the metal forms an alloy with the nanocables at the surface of each nanocable.

17. The method as recited in claim 2, wherein the nanocables are metallic, and further comprising forming a metal over the surface of the metallic nanocables such that the metal forms an alloy with the nanocables at the surface of each nanocable.

18. The method as recited in claim 1, wherein each of the nanocables has a roughened outer surface and a solid core.

19. The method as recited in claim 18, wherein the at least one layer is formed over the roughened outer surface, the at least one layer creating a photovoltaically active p-n junction.

20. The method as recited in claim 19, wherein the roughened outer surface is reflective.

21. The method as recited in claim 1, wherein an outer of each of the nanocables is reflective.

22. The method as recited in claim 2, wherein each of the nanocables has a roughened outer surface and a solid core.

23. The method as recited in claim 22, wherein the at least one layer is formed over the roughened outer surface, the at least one layer creating a photovoltaically active p-n junction.

24. The method as recited in claim 23, wherein the roughened outer surface is reflective.

25. The method as recited in claim 2, wherein an outer of each of the nanocables is reflective.

26. The method as recited in claim 9, wherein each of the nanocables has a roughened outer surface and a solid core.

27. The method as recited in claim 26, wherein the at least one layer is formed over the roughened outer surface, the at least one layer creating a photovoltaically active p-n junction.

28. The method as recited in claim 27, wherein the roughened outer surface is reflective.

29. The method as recited in claim 9, wherein an outer of each of the nanocables is reflective.

* * * * *